(12) United States Patent
Leung

(10) Patent No.: US 7,557,617 B1
(45) Date of Patent: Jul. 7, 2009

(54) DIGITAL DECODER WITH COMPLEMENTARY OUTPUTS

(75) Inventor: Vincent Leung, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 49 days.

(21) Appl. No.: 11/649,618

(22) Filed: Jan. 3, 2007
(Under 37 CFR 1.47)

(51) Int. Cl.
*H03K 19/094* (2006.01)
*G11C 8/00* (2006.01)

(52) U.S. Cl. .................................. 326/105; 326/113

(58) Field of Classification Search ......... 326/105–108, 326/113
See application file for complete search history.

(56) References Cited

U.S. PATENT DOCUMENTS

| | | |
|---|---|---|
| 5,251,173 A | 10/1993 | Wong |
| 5,586,079 A | 12/1996 | Motomura |
| 5,831,986 A | 11/1998 | Sachder |
| 6,198,686 B1 | 3/2001 | Takita et al. |
| 6,215,436 B1 | 4/2001 | Ottini et al. |
| 6,553,536 B1 | 4/2003 | Hassner et al. |
| 6,924,670 B2 | 8/2005 | Azam |

FOREIGN PATENT DOCUMENTS

JP    63005622 A  *  1/1988

OTHER PUBLICATIONS

Translation of JP63-005622 Patent Publication (Jan. 11, 1988).*

* cited by examiner

*Primary Examiner*—Daniel D Chang
(74) *Attorney, Agent, or Firm*—Treyz Law Group; G. Victor Treyz

(57) ABSTRACT

A digital decoder is provided that produces true and complementary output signals. The digital decoder may be formed from n-channel and p-channel metal-oxide-semiconductor transistors. The digital decoder produces four true outputs and four complementary outputs from two inputs. A first of the true outputs and a first of the complementary outputs are provided using a NOR gate and an inverter. A NAND gate and an inverter are used to provide a second of the true outputs and a second of the complementary outputs. Third and fourth complementary outputs are produced using first and second logic circuits. The first and second logic circuits are powered using only a positive power supply voltage. Third and fourth true outputs are produced using third and fourth logic circuits. The third and fourth logic circuits are powered using only a ground power supply voltage. The logic circuits each include an n-channel and p-channel transistor pair.

21 Claims, 8 Drawing Sheets

| A | B | AB01 | NAB01 |
|---|---|------|-------|
| 0 | 0 | 0 | 1 |
| 0 | 1 | 1 | 0 |
| 1 | 0 | 0 | 1 |
| 1 | 1 | 0 | 1 |

FIG. 11

| A | B | AB10 | NAB10 |
|---|---|------|-------|
| 0 | 0 | 0 | 1 |
| 0 | 1 | 0 | 1 |
| 1 | 0 | 1 | 0 |
| 1 | 1 | 0 | 1 |

FIG. 12

| A | B | AB00 | NAB00 |
|---|---|------|-------|
| 0 | 0 | 1    | 0     |
| 0 | 1 | 0    | 1     |
| 1 | 0 | 0    | 1     |
| 1 | 1 | 0    | 1     |

FIG. 13

| A | B | AB11 | NAB11 |
|---|---|------|-------|
| 0 | 0 | 0    | 1     |
| 0 | 1 | 0    | 1     |
| 1 | 0 | 0    | 1     |
| 1 | 1 | 1    | 0     |

DIGITAL DECODER WITH COMPLEMENTARY OUTPUTS

BACKGROUND

This invention relates to decoders for digital logic circuits, and more particularly, to digital decoders with true and complementary output lines that operate with short delay times and that can be implemented using relatively few circuit resources.

Digital decoders convert binary input signals on a relatively small number of input lines to a set of corresponding decoded output signals on a relatively larger number of output lines. For example, a two-input digital decoder receives first and second binary signals as inputs and produces four ($2^2$) corresponding output signals, whereas a three-input decoder produces eight ($2^3$) outputs. Some circuit applications such as memory addressing and tristate driver control require true and complementary control signals. Decoders used in these environments have complementary outputs. For example, a two-input decoder of this type has eight outputs made up of four noninverted and four inverted decoded signals.

Well-designed decoders exhibit short decoding times. Decoders that perform rapidly without undesirable delay times will operate satisfactorily in a variety of integrated circuits and will not unnecessarily slow circuit operation. At the same time, it is important not to use too many circuit resources when implementing a decoder. A decoder that uses a large number of circuit resources will consume a relatively large amount of circuit real estate and may be more prone to failure than less complex designs.

It would therefore be desirable to be able to provide a decoder with an architecture that is capable of supplying both true and complementary decoded outputs while exhibiting short delay times and requiring relatively few circuit resources to implement.

SUMMARY

In accordance with the present invention, digital decoders are provided that can be implemented using a reduced amount of circuit resources while still exhibiting improved switching speeds and reduced power consumption.

The digital decoders use logic circuits that contain complementary transmission gates formed from parallel p-channel and n-channel transistors. When operating in parallel configurations such as these, the p-channel and n-channel transistors can rapidly pass a variety of logic signals. When operated separately, p-channel transistors have difficulties in passing logic zeros and n-channel transistors have difficulties passing logic ones.

Some of the transistors in the decoder are used to form logic gates that are powered using both a positive power supply voltage and a ground power supply voltage. Other transistors are used to form logic circuits that are only powered using a single power supply voltage.

The digital decoder produces four true outputs and four complementary outputs from two inputs.

Further features of the invention, its nature and various advantages will be more apparent from the accompanying drawings and the following detailed description of the preferred embodiments.

BRIEF DESCRIPTION OF THE DRAWINGS

FIGS. 11, 12, 13, and 14 are truth tables illustrating which values are produced on the outputs of the two-input digital decoder of FIG. 10 for each possible combination of input signals in accordance with the present invention.

DETAILED DESCRIPTION

The present invention relates to digital decoders and to integrated circuits in which such decoders are used. The integrated circuits in which the digital decoders may be used may include memory circuits, programmable logic devices, digital signal processing circuits, microprocessors, application specific integrated circuits, or any other suitable integrated circuit containing digital logic. The digital decoders of the present invention may be implemented using any suitable type of logic circuitry. With one particularly suitable arrangement, the digital decoders of the present invention are implemented using complementary metal-oxide-semiconductor (CMOS) transistor technology. Decoder circuitry based on CMOS technology is described herein as an example.

Figure 1:
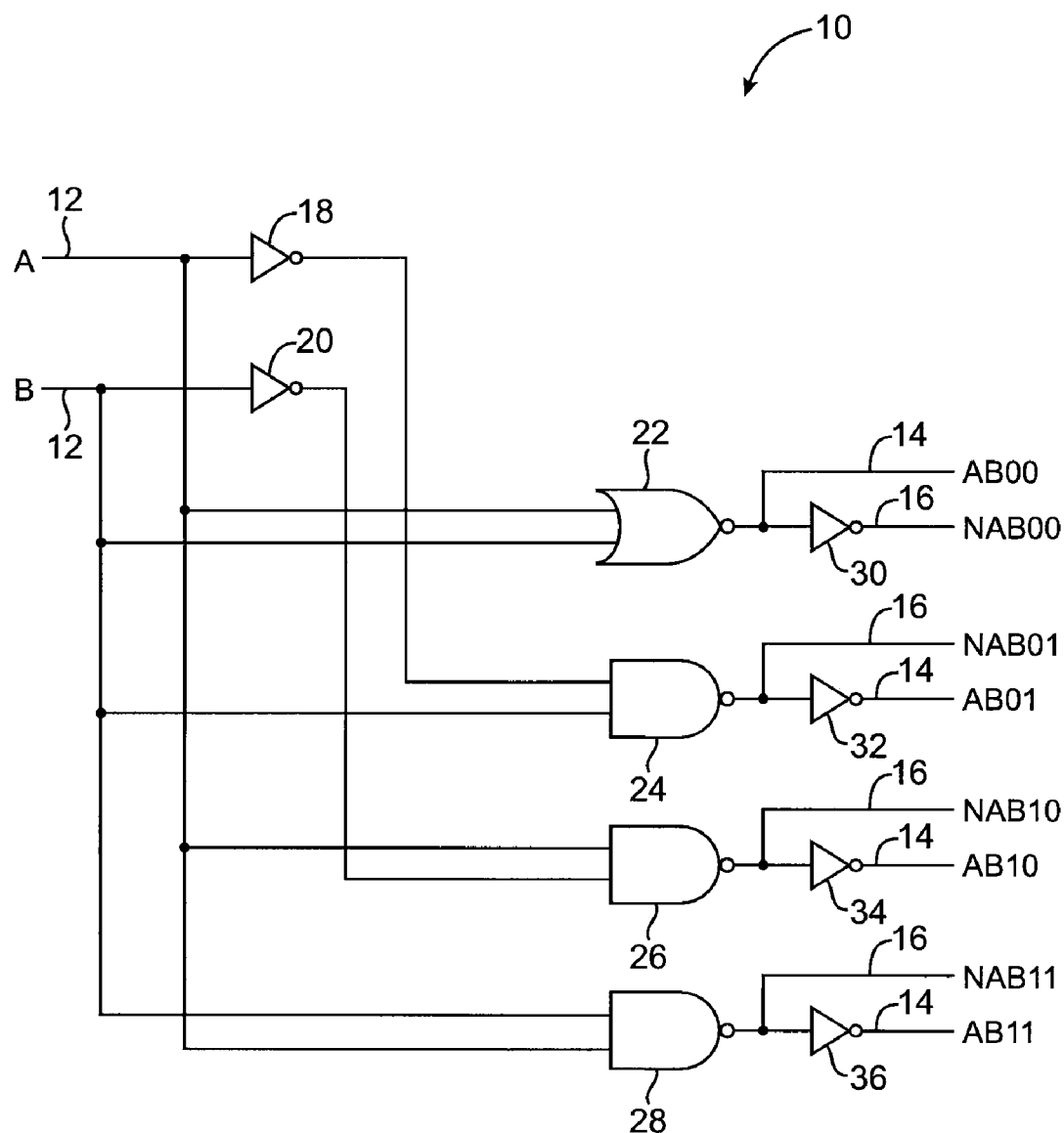
FIG. 1 is a diagram of a conventional two-input decoder with complementary outputs.

A conventional two-input CMOS digital decoder 10 is shown in FIG. 1. Decoder 10 receives input signals on input lines 12 and produces corresponding decoded output signals on output lines 14 and 16. Input lines 12 are sometimes referred to as address lines. Decoder 10 produces both true and complementary outputs. True outputs are produced on output lines 14. The complements of the true outputs are produced on output lines 16.

The two inputs to decoder 10 are labeled "A" and "B." Signals A and B can be either high (i.e., a logic one represented by a high voltage of Vdd) or low (i.e., a logic zero represented by a low voltage of Vss). The values of Vdd and Vss are determined by the power supply levels used on the integrated circuit in which decoder 10 is used. In a typical scenario, the high voltage Vdd is 1.1 volts and the low voltage Vss is 0 volts.

Decoder 10 has CMOS inverters 18, 20, 30, 32, 34, and 36, CMOS NOR gate 22, and CMOS AND gates 24, 26, and 28. In operation, the input signal A may be a 0 or a 1 and the input signal B may be a 0 or a 1, leading to four possible inputs AB=00, AB=01, AB=10, and AB=11. Decoder 10 converts these four encoded digital signals into corresponding true signals AB00, AB01, AB10, and AB11 and respective complementary signals NAB00, NAB01, NAB10, and NAB11. The true signals go high whenever a corresponding encoded input signal is detected at the input of the decoder. If, for example, the input signal is such that A=0 and B=1, the output signal AB01 will be high and its complement NAB01 will be low. The remaining true signals (AB00, AB10, and AB11 in this example) will be low and the remaining complement signals (NAB00, NAB10, and NAB11 in this example) will be high.

Consider, as an example, the situation in which A and B are low. The low A and B signals are routed to the inputs of NOR gate 22. The output of NOR gate 22 is therefore high, so signal AB00 at the output of the NOR gate 22 is high. Inverter 30 inverts the high AB00 signal, taking signal NAB00 at the output of inverter 30 low.

When A and B are low, the NAND gates 24, 26, and 28 each produce high signals at their outputs which are inverted by inverters 32, 34, and 36 to produce decoded signals AB01, AB10, and AB11 that are low. The complement signals NAB01, NAB10, and NAB11 do not pass through the inverters 32, 34, and 36 and are therefore the inverse of AB01, AB10, and AB11 (i.e., NAB01, NAB10, and NAB11 are all high).

As an example, consider the operation of NAND gate 24. The low A signal at the decoder input is inverted by inverter 18 to produce a high signal at a first of the two inputs to NAND gate 24. The low signal B is routed to the other of the two inputs of NAND gate 24. With one input high and the other low, the output of NAND gate 24 is high. The NAND gates 26 and 28 function similarly.

As this example demonstrates, when the input is such that both A and B are low, the signal AB00 is high and the remaining true decoded signals are low.

If A and B are both high, the two inputs to NAND gate 28 will be high and the output of NAND gate 28 will be low. Inverter 36 will invert the low signal to take AB11 high. At the same time, the decoded signals AB00, AB01, and AB10 will be low.

If A is low and B is high (i.e., A=0 and B=1), the output of inverter 18 will be high. The inputs to NAND gate 24 will therefore both be high and the output of NAND gate 24 will be low. Inverter 32 will invert this low signal to produce a high AB01 signal. At the same time, the decoded signals AB00, AB10, and AB11 will be low.

If A is high and B is low (i.e., AB=10), the output of inverter 20 will be high. The inputs to NAND gate 26 will therefore both be high and the output of NAND gate 26 will be low. Inverter 34 will invert this low signal to produce a high AB10 signal. At the same time, the decoded signals AB00, AB01, and AB11 will be low.

Another conventional decoder arrangement is similar to the arrangement of FIG. 1, but uses a NAND gate with its inputs tied to the outputs of inverters 18 and 20 in place of NOR gate 22.

Although the operation of conventional decoders such as decoder 10 of FIG. 1 is often satisfactory, decoders of this type require 28 transistors to implement and have a maximum path delay equal to three gate delays and a minimum path delay equal to one gate delay.

Figure 2:
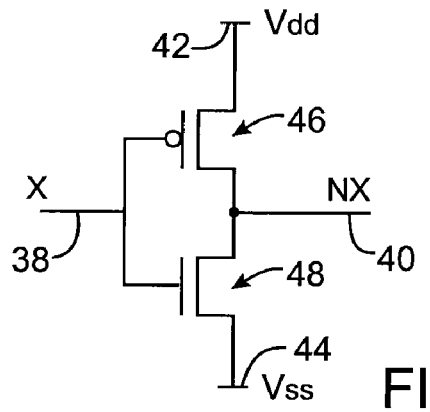
FIG. 2 is a circuit diagram of a complementary metal-oxide-semiconductor (CMOS) inverter.

A circuit diagram of a CMOS inverter such as inverter 18 is shown in FIG. 2. The inverter of FIG. 2 receives an input logic signal X at input line 38 and produces a corresponding inverted output signal NX at output line 40. The inverter is powered using a positive power supply voltage Vdd (e.g., 1.1 volts) and a ground power supply voltage of Vss (e.g., 0 volts). Two transistor 46 and 48 are arranged in series between positive power supply terminal 42 and ground power supply terminal 44. Transistor 46 is a p-channel metal-oxide-semiconductor (PMOS) transistor, which is activated when its gate input is low. Transistor 48 is an n-channel metal-oxide-semiconductor (NMOS) transistor, which is activated when its gate input is high.

Logic signal X at input 38 may either be a logic one (i.e., a high signal represented by voltage Vdd) or a logic zero (i.e., a low signal represented by voltage Vss). If the input on line 38 is low, transistor 46 is turned on and transistor 48 is turned off. Under these conditions, the signal NX on output line 40 is pulled towards Vdd. If the input on line 38 is high, transistor 46 is off and transistor 48 is on, pulling output NX low towards Vss. Because the output NX is high when the input X is low and the output NX is low when the input X is high, the circuit of FIG. 2 serves as an inverter.

Figure 3:
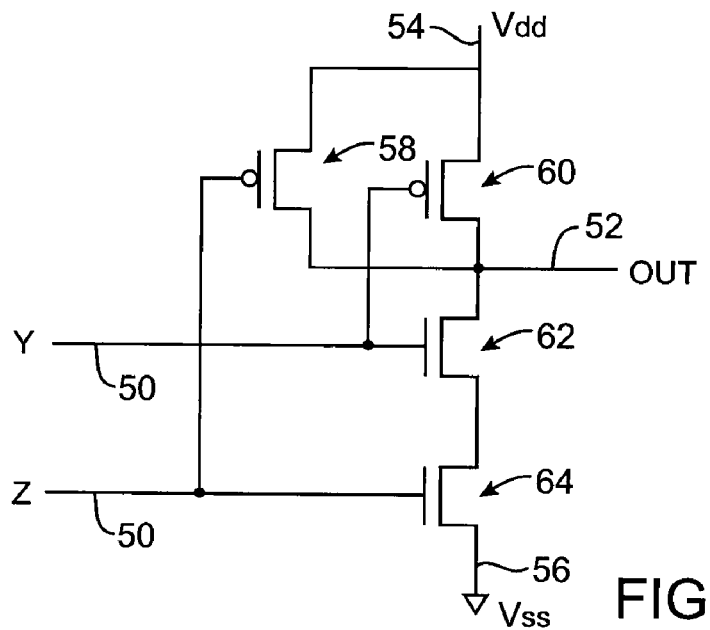
FIG. 3 is a circuit diagram of a two-input CMOS NAND gate.

A two-input CMOS NAND gate such as NAND gates 24, 26, and 28 of FIG. 1 is shown in FIG. 3. Input signals Y and Z are received on input lines 50. A corresponding output signal OUT is produced on output line 52. The NAND gate of FIG. 3 receives positive power supply voltage Vdd at positive power supply terminal 54 and receives ground power supply signal Vss at ground terminal 56. PMOS transistors 58 and 60 have gates connected to inputs Z and Y, respectively. Transistors 62 and 64 are connected in series between output 52 and ground power supply terminal 56.

In operation, the logic circuit of FIG. 3 produces an output signal OUT that is a logical NAND function of inputs Y and Z. If Y and Z are both high, transistors 58 and 60 will be off and transistors 62 and 64 will be on. In this situation, the output line 52 is electrically connected to ground 56 and the output signal OUT is low. If either Y or Z is low or if both Y and Z are low, at least one of transistors 62 and 64 will be off while at least one of transistors 58 and 60 will be on, thereby pulling output signal OUT high.

Figure 4:
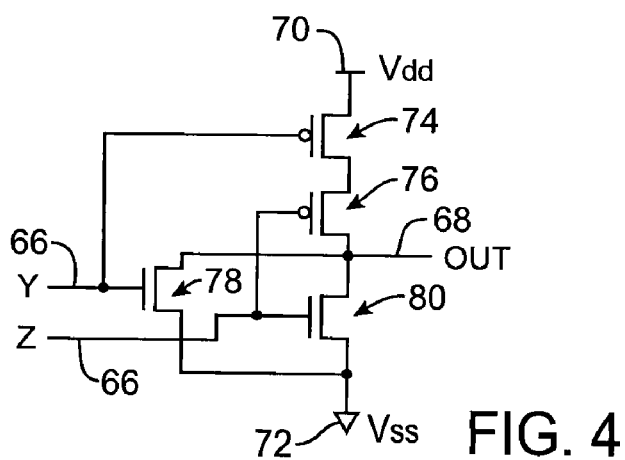
FIG. 4 is a circuit diagram of a two-input CMOS NOR gate.

A CMOS logic NOR gate such as NOR gate 22 of FIG. 1 is shown in FIG. 4. The NOR gate of FIG. 4 receives input logic signals Y and Z on input lines 66 and produces a corresponding output logic signal OUT on output line 68. The NOR gate is powered by a positive power supply signal Vdd at positive power supply terminal 70 and a ground power supply voltage Vss at ground power supply terminal 72. The NOR gate has two series-connected PMOS transistors 74 and 76. Transistors 78 and 80 are NMOS transistors and are connected in parallel between output 68 and ground terminal 72.

In operation, the logic circuit of FIG. 4 produces an output signal OUT at output 68 that is a logical NOR function of inputs Y and Z on input lines 66. If either Y or Z or both Y and Z are high, transistor 78 or transistor 80 or both transistors 78 and 80 will be turned on, while at least one of transistors 74 and 76 will be off. Under these conditions, the output line 68 will be electrically connected to ground Vss and the output signal OUT will be low. If both Y and Z are low, transistors 78 and 80 will be off while transistors 74 and 76 are on, so the output OUT will be high.

As the diagrams of FIGS. 2, 3, and 4 demonstrate, CMOS logic gates are powered by both a positive power supply and a ground power supply. Inverters generally require two transistors such as transistors 46 and 48 of FIG. 2, two-input CMOS NAND gates require four transistors such as transistors 58, 60, 62, and 64 of FIG. 3, and two-input CMOS NOR gates require four transistors such as transistors 74, 76, 78, and 80 of FIG. 4. A two-input decoder 10 of the type shown in FIG. 1 therefore requires 28 transistors to implement using CMOS logic. Twelve transistors are used to implement the six inverters 18, 20, 30, 32, 34, and 36, four transistors are used to implement the NOR gate 22, and twelve transistors are used to implement the three NAND gates 24, 26, and 28.

The switching speed of decoder 10 is limited by its critical signal paths. The critical paths in decoder 10 of FIG. 1 contain three logic gates. For example, the decoded output signal AB01 is produced using a signal that travels from input A through three gates: inverter 18, NAND gate 24, and inverter 32. As another example, the decoded output signal AB10 is produced using a signal that travels from input B through inverter 20, NAND gate 26, and inverter 34. Because the AB01 and AB10 signals must be valid before the output of the decoder 10 will be valid, these slow paths through decoder 10 place an upper limit on the switching speed of decoder 10 of three gate delays.

Another aspect of the performance of decoder 10 relates to its power consumption. In many circuit environments, power consumption can be minimized by reducing the difference between the maximum and minimum path delays exhibited by the decoder. For example, when decoders are used to control tri-state buffers that drive a common bus, minimizing the time that two tri-state buffers are simultaneously conducting will reduce the short circuit current. Balancing the path delays of the decoder will ensure that the short circuit current of the tri-state buffers are minimized. Decoder 10 has a maximum path delay equal to three gate delays and a minimum path delay of one gate delay, so the difference between the maximum and minimum path delays is equal to two gate delays.

Figure 5:
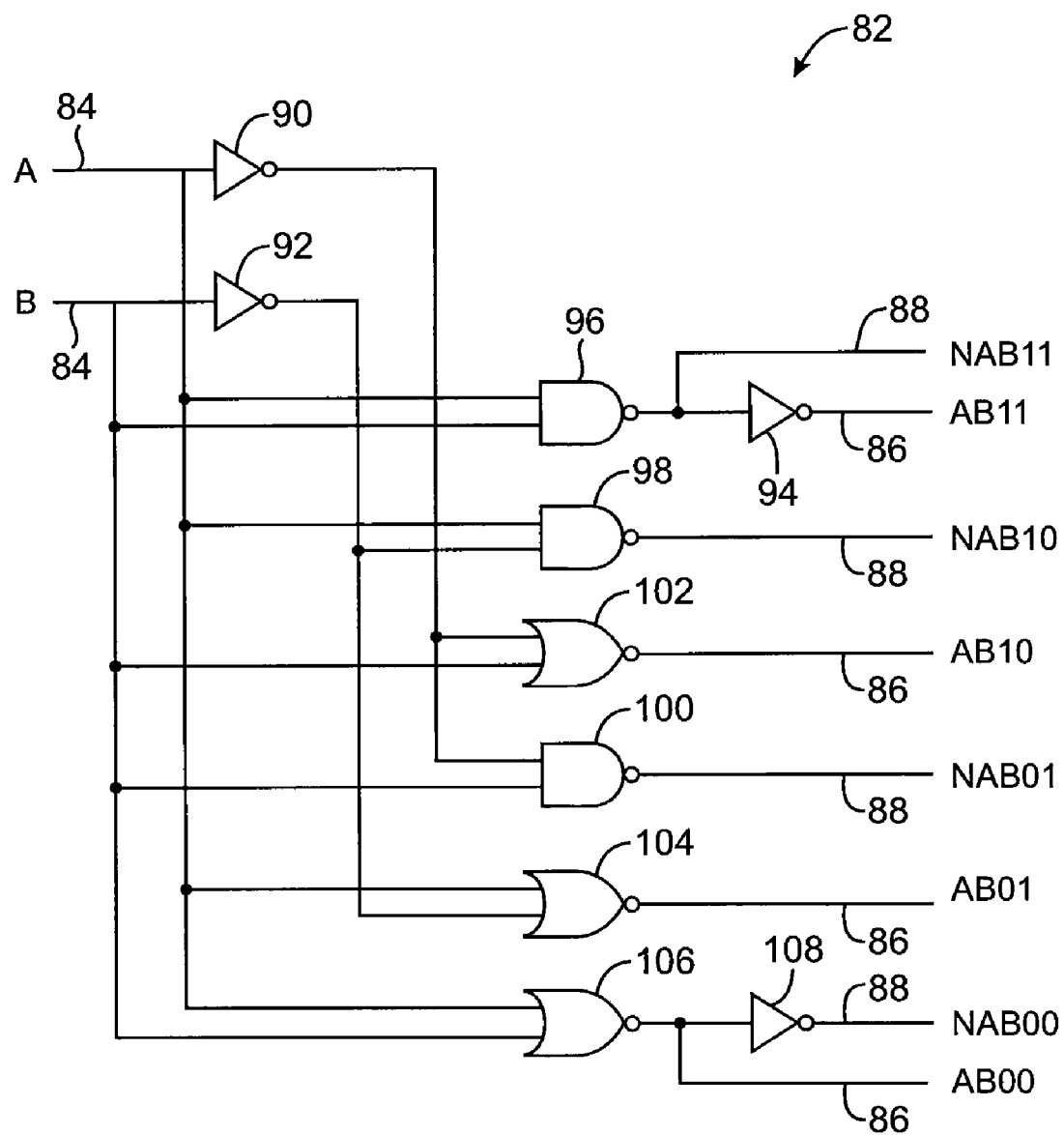
FIG. 5 is a diagram of another conventional two-input decoder with complementary outputs.

An alternative conventional decoder architecture is shown in FIG. 5. With the decoder 82 of FIG. 5, switching speed performance is increased and power consumption is reduced at the expense of increased resource consumption.

Decoder 82 converts encoded input signals A and B on input lines 84 to decoded output signals AB00, AB01, AB10, and AB11 on true output lines 86 and NAB00, NAB01, NAB10, and NAB11 on complement output lines 88. Decoder 82 has inverters 90, 92, 94, and 108, NAND gates 96, 98, and 100, and NOR gates 102, 104, and 106. The logic decoding function performed by decoder 82 is the same as that performed by decoder 10 of FIG. 1. When the inputs A and B are such that AB=00, decoded output signal AB00 goes high and signals AB01, AB10, and AB11 go low. If AB=01, signal AB01 is high and signals AB00, AB10, and AB11 are low. If AB=10, signal AB10 is high and signals AB00, AB01, and AB11 are low. If A and B are high, the decoded signal AB11 goes high while decoded signals AB00, AB01, and AB10 go low. The complement signals on outputs 88 are always the inverse of the true signals on outputs 86.

Consider, as an example, the situation in which A is low and B is low. In this situation, the inputs to NAND gate 96 are both low and the output of NAND gate 96 is high. Inverter 94 inverts the output of NAND gate 96 to produce a low signal AB11.

The critical paths in decoder 82 contain only two logic gates, so the decoder 82 switches in two gate delays. For example, output signal AB11 is produced using signals that flow from inputs A and B through a first gate 96 and a second gate 94. As another example, the output signal AB01 uses a signal that travels from the B input through a first gate 92 and a second gate 104. Because the slowest signal paths in decoder 82 involve no more than two logic gates, the decoder 82 can switch significantly faster than the decoder 10 of FIG. 1, which exhibits switching times equal to three gate delays.

Moreover, the maximum path delay for decoder 82 is equal to two gate delays and the minimum path delay for decoder 82 is equal to one gate delay, so the difference between the maximum and minimum path delays for decoder 82 is equal to one gate delay. Decoder 82 therefore tends to consume less power than decoder 10, which exhibits a maximum to minimum path delay difference of two gate delays.

However, a decoder 82 of the type shown in FIG. 5 uses more circuit resources than a decoder 10 of the type shown in FIG. 1. The four inverters in decoder 82 require a total of eight CMOS transistors. The three NAND gates require twelve transistors. There are three NOR gates, each of which requires four transistors, so twelve NOR gate transistors are required. In total, the decoder design of FIG. 5 requires 32 transistors. Circuit real estate in integrated circuits is a scare commodity, so the use of 32 transistors in decoder 82 in place of the 28 transistors used in the decoder 10 of FIG. 1 gives rise to a significant real estate penalty.

Decoders in accordance with the present invention can be implemented using fewer transistors while still exhibiting fast switching speeds and low power consumption. Such decoders use logic circuits that contain complementary transmission gates. The complementary transmission gates are formed from parallel p-channel and n-channel transistors. When operating in parallel configurations such as these, the p-channel and n-channel transistors can rapidly pass a variety of logic signals. When operated separately, p-channel transistors have difficulties in passing logic zeros and n-channel transistors have difficulties passing logic ones.

Figure 6:
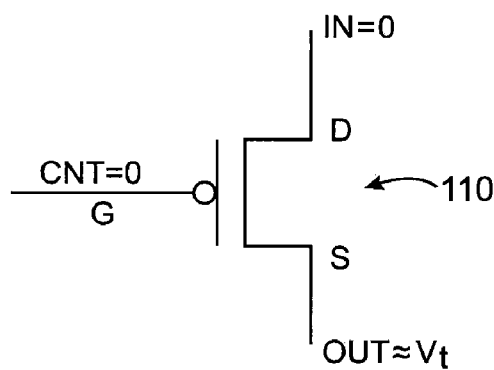
FIGS. 6 and 7 are diagrams illustrating the performance of p-channel metal-oxide-semiconductor transistors while passing logic ones and zeros from their inputs to their outputs.
Figure 7:
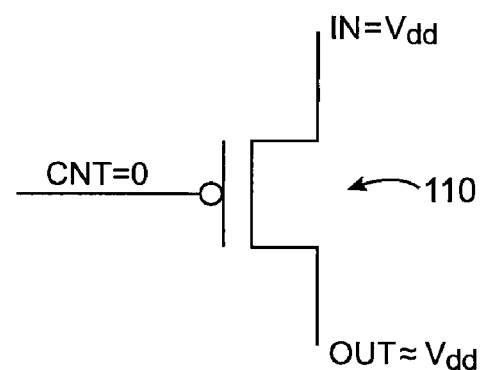

An illustrative p-channel transistor 110 is shown in FIGS. 6 and 7. P-channel transistor 110 has a gate terminal G, a drain terminal D and a source terminal S. The gate terminal G serves as a control terminal and receives control signal CNT. Drain and source terminals D and S are sometimes collectively referred to as drain-source terminals. In the arrangement shown in FIGS. 6 and 7, one drain-source terminal serves as an input and receives input signal IN, while another drain-source terminal serves as an output and provides a corresponding output signal OUT. When a low gate control signal CNT is applied to transistor 110 as shown in FIGS. 6 and 7, the transistor 110 is activated and can pass signals from its input to its output.

The behavior of PMOS transistor 110 differs depending on whether the input signal IN is low or high. If the input signal IN is low, as shown in FIG. 6, the output signal OUT will be about one threshold voltage Vt above ground (i.e., OUT will be about Vt). If the output voltage OUT is above Vt, the gate-to-source voltage Vgs of transistor 110 will be more than Vt and transistors 110 will turn on. With transistor 110 turned on, the low voltage of the input signal IN will pull the voltage of the output signal OUT low. If the output voltage OUT starts to fall below Vt, the gate-to-source voltage Vgs of transistor 110 will fall below Vt and the transistor 110 will turn off. In a typical PMOS transistor, Vt is about 300 mV, which limits the output signal OUT to about 300 mV.

If, however, the input signal is high (i.e., 1.1 volts), as shown in FIG. 7, the gate-source voltage Vgs of transistor 110 will exceed Vt and transistor 110 will be turned on. With transistor 110 turned on, the drain and source of transistor 110 are electrically connected to each other and the output signal OUT will be pulled to Vdd.

Because of these switching characteristics, PMOS transistors are able to pass high input signals to their outputs with little or no loss in signal quality, as shown in FIG. 7, whereas PMOS transistors are unable to pass low signals from their inputs to their outputs without signal degradation, as shown in FIG. 6.

Figure 8:
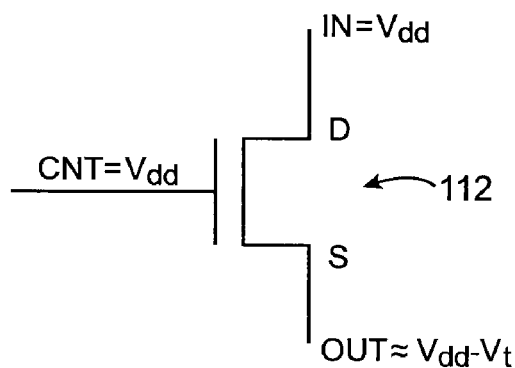
FIGS. 8 and 9 are diagrams illustrating the performance of n-channel metal-oxide-semiconductor transistors while passing logic ones and zeros from their inputs to their outputs.
Figure 9:
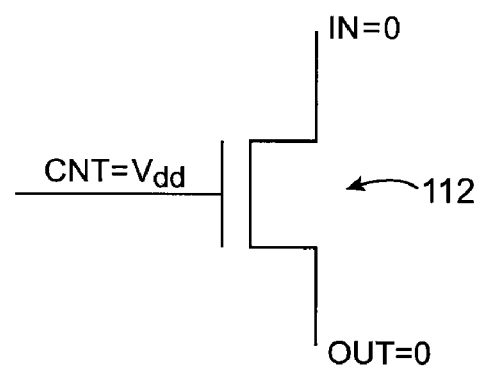

FIGS. 8 and 9 show an NMOS transistor 112 that is being activated by applying a high control signal CNT to gate G. The behavior of NMOS transistors such as NMOS transistor 112 also differs depending on whether the transistor input signal IN is high or low.

As shown in FIG. 8, when the input signal IN is high, the output signal OUT is unable to rise above Vdd-Vt. If the output signal OUT falls below this voltage, the gate-source voltage Vgs of transistor will exceed the transistor's threshold voltage Vt, which will turn the transistor 112 on and will electrically connect output OUT to input IN. This will pull the output OUT high. If the output voltage OUT rises above about Vdd−Vt, the gate-source voltage Vgs of the transistor 112 will be less than the transistor's threshold voltage Vt, which will turn transistor 112 off. This will cause the output signal OUT to drop back towards Vdd-Vt.

As shown in FIG. 9, when the input signal IN is low, the gate-source voltage Vgs of transistor 112 will exceed the threshold voltage Vt, thereby turning transistor 112 fully on. With transistor 112 fully on, the output OUT is electrically connected to the low input signal IN, pulling output signal OUT low.

These switching characteristics allow NMOS transistors to pass low input signals to their outputs with little or no loss in signal quality, as shown in FIG. 9. As shown in FIG. 8, NMOS transistors are unable to pass high signals from their inputs to their outputs without signal degradation.

The architecture of the decoder of the present invention uses low-transistor-count logic circuits that include parallel NMOS and PMOS transistors in place of at least some of the logic gates used in conventional decoder architectures. This design reduces the number of transistors that are required to implement the decoder while producing fast switching speeds. This design also minimizes the difference between the path delays for the fastest and slowest paths.

Figure 10:
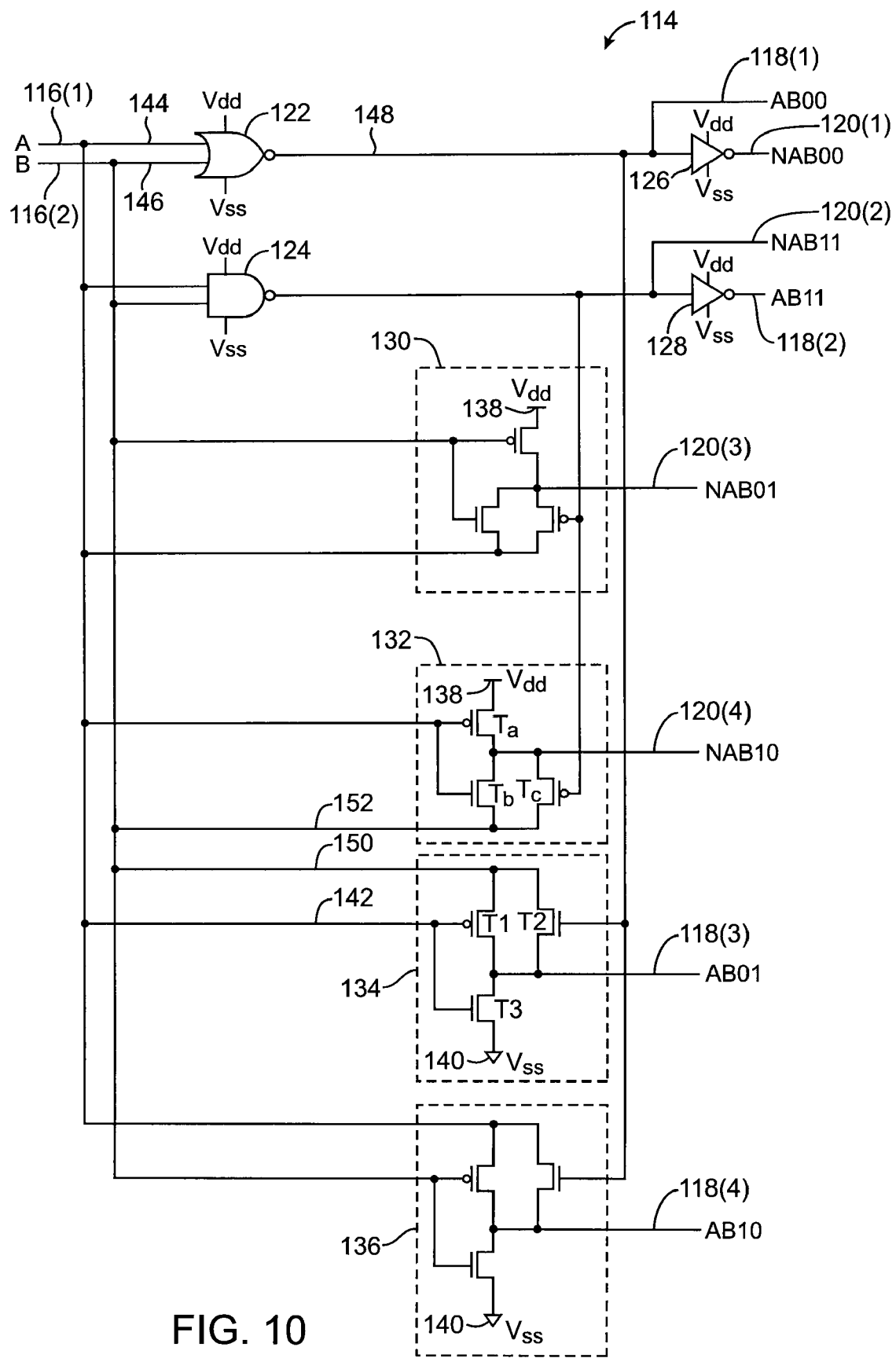
FIG. 10 is a circuit diagram of an illustrative two-input digital decoder with complementary outputs in accordance with the present invention.

A circuit diagram of a decoder 114 in accordance with the present invention is shown in FIG. 10. As shown in FIG. 10, decoder 114 has two inputs 116 (i.e., 116(1) and 116(2)), which receive logic input signals A and B. Inputs 116 are sometimes referred to as address lines. Decoder 114 decodes the encoded input signals A and B and generates corresponding decoded output signals on output lines 118 (i.e., 118(1), 118(2), 118(3), and 118(4)) and 120 (i.e., 120(1), 120(2), 120(3), and 120(4)). True output signals AB00, AB01, AB10, and AB11 are produced on output lines 118 and respective complementary output signals NAB00, NAB01, NAB10, and NAB11 are produced on output lines 120.

Decoder 114 has a NOR gate 122 that receives the A and B input signals. NOR gate 122 may be, for example, a NOR gate of the type shown in FIG. 4. A NAND gate 124 receives the A and B input signals in parallel with the NOR gate. NAND gate 126 may be, for example, a NAND gate of the type shown in FIG. 3. The outputs of the NOR gate 122 and NAND gate 124 are provided to respective inverters 126 and 128. Inverters 126 and 128 may be of the type shown in FIG. 2.

Decoder 114 also has logic circuits 130, 132, 134, and 136. Unlike NOR and NAND logic gates, the logic circuits 130, 132, 134, and 136 are not powered using both power supply rails. Logic circuits 130 and 132 are only powered using a positive power supply voltage Vdd at positive power supply terminals 138, not a ground power supply voltage Vss. Logic circuits 134 and 136 are powered using Vss at ground power supply terminals 140, but not Vdd.

Logic circuits 130 and 132 each receive as inputs logic input signals A and B and the output of NAND gate 124. Logic circuits 134 and 136 receive logic signals A and B and the output of NOR gate 122 as inputs.

Logic circuit 136 produces the output signals AB10, which is high when A is high and B is low. Logic circuit 132 produces the complement of signal AB10 (i.e., signal NAB10). Signal NAB10 is the inverse of signal AB10.

Logic circuit 134 produces signal AB01, which is high when A is low and B is high. Complementary output signal NAB01 is produced by logic circuit 130.

The logic circuits 130, 132, 134, and 136 contain pairs of parallel NMOS and PMOS transistors. When one of the transistors in these complementary transistor pairs is experiencing difficulty in passing logic signals, the other transistor in the pair helps to complete the necessary switching operation. For example, when an NMOS transistor is having difficulty passing a logic one as described in connection with FIG. 8, a PMOS transistor that is operating in parallel with the NMOS transistor assists the NMOS transistor by passing the logic one to a shared output. Similarly, when a PMOS transistor is having difficulty passing a logic zero from its input to its output as described in connection with FIG. 6, a parallel NMOS transistor is used to assist the PMOS transistor.

Because the PMOS and NMOS transistors assist each other, the logic circuits 130, 132, 134, and 136 exhibit switching speeds that are comparable to the switching speeds associated with traditional NOR and NAND logic gates. In practice, switching speeds are influenced by output loading capacitance, so switching times vary as a function of output loading. If the output lines for signals AB01, AB10, NAB01, and NAB10 are lightly loaded, the delay time associated with switching circuits 130, 132, 134, and 136 might be equal to about 10%-15% more than a conventional gate delay. Under more heavily loaded conditions, the switching speed for circuits 130, 132, 134, and 136 will decrease, but switching delay times for circuits 130, 132, 134, and 136 will still be less than two gate delays.

The critical paths for decoder 114 are the paths that pass through two logic gates. In particular, the signal NAB00 is produced using signals that pass through a first logic gate 122 and a second logic gate 126. Similarly, the signal AB11 is produced using signals that pass through a first logic gate 124 and a second logic gate 128. The signals NAB00 and AB11 therefore exhibit two gate delays. Signals NAB00 and AB11 are the slowest decoded output signals produced by decoder 114, because the switching delay times for circuits 130, 132, 134, and 136 are each less than two gate delays.

The maximum path delay associated with decoder 114 is equal to two gate delays while the minimum path delay associated with decoder 114 is equal to one gate delay. In contrast, the conventional decoder 10 of FIG. 1 has a minimum path delay equal to one gate delay and a maximum path delay of three gate delays. As a result, the difference between the maximum and minimum path delays for the decoder 114 of FIG. 10 (one gate delay) is less than the corresponding path delay difference in the conventional decoder of FIG. 1 (two gate delays).

Minimizing the difference between the maximum and the minimum path delays can reduce power consumption significantly. Decoders with complementary outputs are often used to drive tristate buffers. For example, decoders can produce complementary outputs that drive tristate buffers in programmable logic device look-up tables and tristate drivers in logic circuits such as memories. In environments such as these, tristate buffers drive a common circuit network. When tristate buffers are used to drive a common circuit network, current is wasted whenever one tristate driver is turned off while another tristate driver is turned on. This is because there is a direct path between the positive supply (sometimes called VDD) and ground (sometimes called VSS). If there is a substantial time difference between the time at which one tristate driver is turned on and the other is turned off, the amount of wasted current can be considerable. In an ideal situation, one would like any two tristate buffers that drive a common circuit network to switch simultaneously. Although absolutely simultaneous switching is not possible in practice, the decoder circuit of FIG. 10 comes close to the ideal limit by exhibiting a minimal difference between its maximum and minimum path delays The design of decoder 114 uses a relatively small number of transistors. In decoder 114, four transistors are used to implement inverters 126 and 128. Eight transistors are used to implement NOR gate 122 and NAND gate 124. Logic circuits 130, 132, 134, and 136 require a total of twelve transistors. The decoder 114 is therefore implemented using 24 transistors.

The decoder 114 uses fewer transistors than the conventional decoder 10 of FIG. 1 (which uses 28 transistors) and the conventional decoder 82 of FIG. 5 (which uses 32 transistors). At the same time, the two-gate-delay switching speed of decoder 114 is faster than the three-gate-delay switching speed of conventional decoder 10 of FIG. 1 and matches the switching speed of conventional decoder 82 of FIG. 5. Because decoder 114 exhibits a difference of only one gate delay between its maximum and minimum path delays, power consumption is minimized.

FIGS. 11, 12, 13, and 14 are truth tables showing how the decoded outputs AB00, AB01, AB10, AB11, go high in response to corresponding sets of input signals A and B.

For example, the truth table of FIG. 13 shows how the decoded output signal AB00 goes high when A is low and B is low (i.e., when A=0 and B=0), whereas the remaining decoded output signals AB01, AB10, and AB11 are low (in this example). The complementary output signals NAB00, NAB01, NAB10, and NAB11 are the inverse of signals AB00, AB01, AB10, and AB11. When signals A and B are both low, the output of NOR gate 122 is high, so AB00 is high, as shown in the FIG. 13 truth table. Inverter 126 inverts the high AB00 signal, so that NAB00 is low.

The truth table of FIG. 14 shows the output signals that are produced when A=1 and B=1 (i.e., when A and B are both high). When A and B are high, the output of NAND gate 124 is low. The low output signal from the output of NAND gate 124 is conveyed to the NAB11 output line 120(2). Inverter 128 inverts the low NAB11 signal to produce signal AB11 on the output line 118(2) that is connected to the output of inverter 128.

When A is high and B is low or when B is high and A is low, the output of NOR gate 122 is low and the output of NAND gate 124 is high. As shown in the truth tables of FIGS. 13 and 14, the signals AB00 and AB11 are therefore low. Under these conditions, the signals AB01 and AB10 (and complementary signals NAB01 and NAB10) are produced using logic circuits 130, 132, 134, and 136.

Consider, as an example, the output AB01 of logic circuit 134, which corresponds to the truth table of FIG. 11. Line 142 passes the input signal A to the gate of PMOS transistor T1 and the gate of NMOS transistor T3.

When A is high, transistor T1 is off and transistor T3 is on. Lines 144 and 146 pass the high A signal and the low B signal to the inputs of NOR gate 122. Because A is high, the output of NOR gate 122 is low, regardless of the state of B. The low signal at the output of NOR gate 122 is passed to the gate of transistor T2 via path 148. Transistor T2 is an NMOS transistor and is therefore turned off by the low signal on its gate. With transistors T1 and T2 off and transistor T3 on, the output line for signal AB01 is tied to ground terminal 140. Signal AB01 is therefore pulled low to Vss both when B is high and when B is low, as shown in the last two rows of the third column of the truth table of FIG. 11.

When A is low, transistor T1 is on and transistor T3 is off. The low A signal is applied to the input of NOR gate 122 via line 144. The other input of NOR gate 122 receives the signal B via line 146. Because the A signal input is low, the output of NOR gate 122 is equal to the complement of logic signal B (called NB). The signal NB is passed from the output of NOR gate 122 to the gate of transistor T2 via path 148.

If B is high when A is low, signal NB will be low, turning NMOS transistor T2 off. Because NMOS transistor T2 is off, NMOS transistor T2 will not be able to transmit the high B signal from path 150 to output AB01. However, PMOS transistor T1 is connected in parallel with transistor T2. PMOS transistor T1 is turned on, because the A input signal on line 142 is low. The low A signal on line 142 also turns NMOS transistor T3 off. With transistor T3 off, turning transistor T1 on allows the high B signal from line 150 to propagate through transistor T1 to output AB01. As shown by the row in the table of FIG. 11 corresponding to A=0 and B=1, AB01 therefore goes high.

If B is low when A is low, the low A signal on the gates of transistors T1 and T3 will turn transistor T1 on and transistor T3 off. With transistor T1 on, transistor T will start to pass the low B signal on path 150 to output AB01. However, because transistor T1 is a PMOS transistor, transistor T1 will have difficulty in successfully passing the low B signal from line 150 to output AB01. As described in connection with FIG. 6, PMOS transistors have difficulty in passing logic zero values and tend to produce output signals that are not at Vss, but rather are at a somewhat higher voltage of Vt (e.g., 300 mV).

The presence of parallel NMOS transistor T2 helps circuit 134 overcome this difficulty. With B and A low, the output of NOR gate 122 goes high. Path 148 passes this high signal to the gate of NMOS transistor T2 and turns transistor T2 on slightly after PMOS transistor T1 is turned on. Transistor T2 is an NMOS transistor and therefore successfully conveys the low B signal from line 150 onto output AB01. As shown in table of FIG. 11, when A and B are low, the output signal AB01 is low. There is one gate delay required for transistor T2 to turn on while B is transitioning from 1 to 0. However, this one-gate-delay penalty is approximately the same amount of delay that is required for the transition from B=1 to B=Vt. In other words, the PMOS transistor T1 is able to pass the signal B from input 116 as it transitions from B=1 to B=Vt, so that by the time the NMOS transistor T2 is needed to help handle the rest of transition (B=Vt to 0), the gate of transistor T2 will already be high. The one-gate-delay penalty associated with transistor T2 therefore does not add any delay to the decoder and the decoder exhibits a switching time of close to one gate delay.

In circuit 136, the A and B signals are reversed relative to the circuit 134. Circuit 136 therefore operates similarly to circuit 134, but with A and B reversed. The output AB10 of circuit 136 for various input conditions is shown in the truth table of FIG. 12.

Circuits 130 and 132 are used to produce the complementary output signals NAB01 (the complement to signal AB01) and NAB10 (the complement to signal AB10). Consider, as an example, the operation of circuit 132.

If input signal A is low, then transistor Ta in circuit 132 will be on and transistor Tb in circuit 132 will be off. With A low, the output of NAND gate 124 will be high, turning transistor Tc off. With transistors Tb and Tc off and transistor Ta on, the output signal NAB10 will be high, regardless of the state of signal B. This functionality is illustrated by the two rows in the truth table of FIG. 12 corresponding to A=0.

If input signal A is high, then transistor Ta in circuit 132 is off and transistor Tb is on. Under these conditions, the output signal NAB10 depends on the state of B.

If B is low while A is high, the output of NAND gate 124 will be high and transistor Tc of circuit 132 will be off. Although transistor Tc is off, the low B signal will be easily passed from line 152 to output NAB10 through NMOS transistor Tb, which is on. This causes signal NAB10 to go low, as shown in the row of the table in FIG. 12 corresponding to A=1, B=0.

If B is high while A is high, transistor Tb of circuit 132 will start to pass the high B signal from line 152 to output NAB10, but will have difficulty as described in connection with FIG. 8. However, with B high and A high, the output of NAND gate 124 will go low. Once the output of NAND gate 124 goes low, parallel transistor Tc is turned on. Transistor Tc is a PMOS transistor and is therefore able to assist the NMOS transistor Tb in passing the high B signal from line 152 to output NAB10. As shown in the row of the table in FIG. 12 corresponding to A=1, B=1, this ensures that the NAB10 signal goes high.

In circuit 130, the A and B signals are reversed relative to the circuit 132. Circuit 130 therefore operates similarly to circuit 132, but with A and B reversed. The output NAB01 of circuit 130 for various states of input signals A and B is shown in the truth table of FIG. 11.

Decoders with both true and complementary output lines are particularly useful in application such as memory addressing and controlling tristate drivers. If desired, however, two-input decoders such as decoder 114 of FIG. 10 may be constructed without some or all of the complementary output lines or without some or all of the true output lines.

Figure 15:
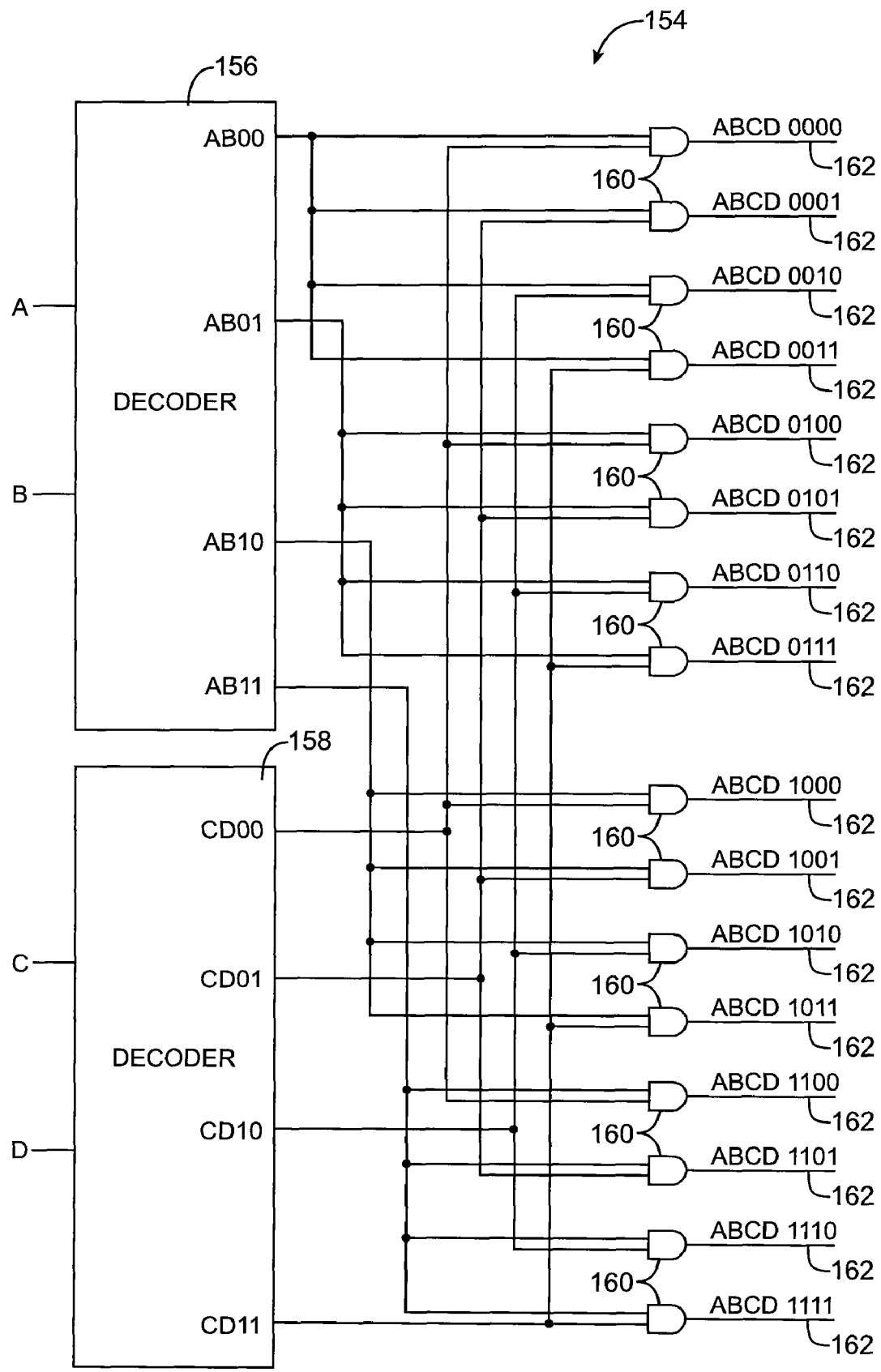
FIG. 15 is a circuit diagram illustrating how two two-input decoders can be combined using logic gates to produce a four-input decoder in accordance with the present invention.

Decoders with more than two inputs can be constructed by combining a number of two-input decoders of the type shown in FIG. 10. An illustrative four-input decoder 154 that has been constructed from two two-input decoders 156 and 158 is shown in FIG. 15. In the example of FIG. 15, decoder 156 produces four true outputs AB00, AB01, AB10, and AB11 in response to input signals A and B. Decoder 158 produces four true outputs CD00, CD01, CD10, and CD11 in response to input signals C and D. Decoders 156 and 158 may, if desired, be two-input decoders of the type shown in FIG. 10 that produce both true and complementary outputs. Complementary outputs are not shown in FIG. 15 to avoid over-complicating the drawing.

As shown in FIG. 15, the decoded outputs from decoder 156 and the decoded outputs from decoder 158 may be combined using AND gates 160. The resulting outputs 162 from the AND gates serve as the decoded outputs of the four-input decoder 154.

The foregoing is merely illustrative of the principles of this invention and various modifications can be made by those skilled in the art without departing from the scope and spirit of the invention.

What is claimed is:

1. A digital decoder having first and second inputs and first, second, third, and fourth true and complementary outputs, comprising:
logic circuitry that supplies a high signal to the first true output whenever the first and second inputs are low and that supplies a high signal to the second true output whenever the first and second inputs are high, wherein the logic circuitry comprises a NOR gate having an output connected to the first true output;
first and second logic circuits that are powered using only a positive power supply terminal and that supply output signals for the third and fourth complementary outputs; and
third and fourth logic circuits that are powered using only a ground power supply terminal and that supply output signals for the third and fourth true outputs.

2. The digital decoder defined in claim 1 wherein the logic circuitry comprises first and second inverters, wherein the first inverter produces the first complementary output from the first true output and wherein the second inverter produces the second true output from the second complementary output.

3. A digital decoder having first and second inputs and first, second, third, and fourth true and complementary outputs, comprising:
logic circuitry that supplies a high signal to the first true output whenever the first and second inputs are low and that supplies a high signal to the second true output whenever the first and second inputs are high;
first and second logic circuits that are powered using only a positive power supply terminal and that supply output signals for the third and fourth complementary outputs; and
third and fourth logic circuits that are powered using only a ground power supply terminal and that supply output signals for the third and fourth true outputs, wherein the logic circuitry comprises a NAND gate having an output connected to the second complementary output.

4. The digital decoder defined in claim 1 wherein the logic circuitry comprises:
a NAND gate having an output connected to the second complementary output.

5. The digital decoder defined in claim 1 wherein the logic circuitry comprises:
a NAND gate having an output connected to the second complementary output; and
first and second inverters, wherein the first inverter produces the first complementary output from the first true output and wherein the second inverter produces the second true output from the second complementary output.

6. The digital decoder defined in claim 1 wherein the first and second logic circuits each comprise n-channel and p-channel transistors connected in parallel.

7. The digital decoder defined in claim 1 wherein the first and second logic circuits each comprise:
n-channel and p-channel transistors connected in parallel; and
a p-channel transistor connected in series between the parallel n-channel and p-channel transistors and the positive power supply terminal.

8. The digital decoder defined in claim 1 wherein the first and second logic circuits each comprise:
n-channel and p-channel transistors connected in parallel; and
a p-channel transistor connected in series between the parallel n-channel and p-channel transistors and the positive power supply terminal, wherein the third complementary output is connected to a node located between the parallel n-channel and p-channel transistors and the series-connected p-channel transistor in the first logic circuit.

9. The digital decoder defined in claim 1 wherein the third and fourth logic circuits each comprise n-channel and p-channel transistors connected in parallel.

10. The digital decoder defined in claim 1 wherein the third and fourth logic circuits each comprise:
n-channel and p-channel transistors connected in parallel; and
an n-channel transistor connected in series between the parallel n-channel and p-channel transistors and the ground power supply terminal.

11. The digital decoder defined in claim 1 wherein the third and fourth logic circuits each comprise:
n-channel and p-channel transistors connected in parallel; and an n-channel transistor connected in series between the parallel n-channel and p-channel transistors and the ground power supply terminal, wherein the third true output is connected to a node located between the parallel n-channel and p-channel transistors and the series-connected n-channel transistor.

12. The digital decoder defined in claim 1 wherein the first, second, third, and fourth logic circuits each comprise an n-channel and p-channel transistor pair connected in parallel.

13. The digital decoder defined in claim 1 wherein the first, second, third, and fourth logic circuits each comprise an n-channel and p-channel transistor pair connected in parallel, the digital decoder further comprising:
   in the first logic circuit, a first p-channel transistor connected in series between the transistor pair in the first logic circuit and the positive power supply terminal, wherein the third complementary output is connected to a node located between the first p-channel transistor and the transistor pair in the first logic circuit;
   in the second logic circuit, a second p-channel transistor connected in series between the transistor pair in the second logic circuit and the positive power supply terminal, wherein the fourth complementary output is connected to a node located between the second p-channel transistor and the transistor pair in the second logic circuit;
   in the third logic circuit, a first n-channel transistor connected in series between the transistor pair in the third logic circuit and the ground power supply terminal, wherein the third true output is connected to a node located between the first n-channel transistor and the transistor pair in the third logic circuit; and
   in the fourth logic circuit, a second n-channel transistor connected in series between the transistor pair in the fourth logic circuit and the ground power supply terminal, wherein the fourth true output is connected to a node located between the second n-channel transistor and the transistor pair in the fourth logic circuit.

14. The digital decoder defined in claim 1 wherein the first, second, third, and fourth logic circuits each comprise an n-channel and p-channel transistor pair connected in parallel, the digital decoder further comprising:
   in the first logic circuit, a first p-channel transistor connected in series between the transistor pair in the first logic circuit and the positive power supply terminal, wherein the third complementary output is connected to a node located between the first p-channel transistor and the transistor pair in the first logic circuit and wherein the first p-channel transistor has a gate connected to the second input;
   in the second logic circuit, a second p-channel transistor connected in series between the transistor pair in the second logic circuit and the positive power supply terminal, wherein the fourth complementary output is connected to a node located between the second p-channel transistor and the transistor pair in the second logic circuit and wherein the second p-channel transistor has a gate connected to the first input;
   in the third logic circuit, a first n-channel transistor connected in series between the transistor pair in the third logic circuit and the ground power supply terminal, wherein the third true output is connected to a node located between the first n-channel transistor and the transistor pair in the third logic circuit and wherein the first n-channel transistor has a gate connected to the first input; and
   in the fourth logic circuit, a second n-channel transistor connected in series between the transistor pair in the fourth logic circuit and the ground power supply terminal, wherein the fourth true output is connected to a node located between the second n-channel transistor and the transistor pair in the fourth logic circuit and wherein the second n-channel transistor has a gate connected to the second input.

15. The digital decoder defined in claim 1 wherein the first, second, third, and fourth logic circuits each comprise an n-channel and p-channel transistor pair connected in parallel, the digital decoder further comprising:
   in the first logic circuit, a first p-channel transistor connected in series between the transistor pair in the first logic circuit and the positive power supply terminal, wherein the third complementary output is connected to a node located between the first p-channel transistor and the transistor pair in the first logic circuit, wherein the first p-channel transistor has a gate connected to the second input, and wherein the n-channel transistor in the transistor pair in the first logic circuit has a gate connected to the gate of the first p-channel transistor;
   in the second logic circuit, a second p-channel transistor connected in series between the transistor pair in the second logic circuit and the positive power supply terminal, wherein the fourth complementary output is connected to a node located between the second p-channel transistor and the transistor pair in the second logic circuit, wherein the second p-channel transistor has a gate connected to the first input, and wherein the n-channel transistor in the transistor pair in the second logic circuit has a gate connected to the gate of the second p-channel transistor;
   in the third logic circuit, a first n-channel transistor connected in series between the transistor pair in the third logic circuit and the ground power supply terminal, wherein the third true output is connected to a node located between the first n-channel transistor and the transistor pair in the third logic circuit, wherein the first n-channel transistor has a gate connected to the first input, and wherein the p-channel transistor in the transistor pair in the third logic circuit has a gate connected to the gate of the first n-channel transistor; and
   in the fourth logic circuit, a second n-channel transistor connected in series between the transistor pair in the fourth logic circuit and the ground power supply terminal, wherein the fourth true output is connected to a node located between the second n-channel transistor and the transistor pair in the fourth logic circuit, wherein the second n-channel transistor has a gate connected to the second input, and wherein the p-channel transistor in the transistor pair in the fourth logic circuit has a gate connected to the gate of the second n-channel transistor.

16. The digital decoder defined in claim 1 wherein the first, second, third, and fourth logic circuits each comprise an n-channel and p-channel transistor pair connected in parallel, the digital decoder further comprising:
   in the first logic circuit, a first p-channel transistor connected in series between the transistor pair in the first logic circuit and the positive power supply terminal, wherein the third complementary output is connected to a node located between the first p-channel transistor and the transistor pair in the first logic circuit, wherein the first p-channel transistor has a gate connected to the second input, wherein the n-channel transistor in the transistor pair in the first logic circuit has a gate connected to the gate of the first p-channel transistor, and wherein the p-channel transistor in the transistor pair in the first logic circuit has a gate connected to a first logic gate output;

in the second logic circuit, a second p-channel transistor connected in series between the transistor pair in the second logic circuit and the positive power supply terminal, wherein the fourth complementary output is connected to a node located between the second p-channel transistor and the transistor pair in the second logic circuit, wherein the second p-channel transistor has a gate connected to the first input, wherein the n-channel transistor in the transistor pair in the second logic circuit has a gate connected to the gate of the second p-channel transistor, and wherein the p-channel transistor in the transistor pair in the second logic circuit has a gate connected to the first logic gate output;

in the third logic circuit, a first n-channel transistor connected in series between the transistor pair in the third logic circuit and the ground power supply terminal, wherein the third true output is connected to a node located between the first n-channel transistor and the transistor pair in the third logic circuit, wherein the first n-channel transistor has a gate connected to the first input, wherein the p-channel transistor in the transistor pair in the third logic circuit has a gate connected to the gate of the first n-channel transistor, and wherein the n-channel transistor in the transistor pair in the third logic circuit has a gate connected to a second logic gate output; and in the fourth logic circuit, a second n-channel transistor connected in series between the transistor pair in the fourth logic circuit and the ground power supply terminal, wherein the fourth true output is connected to a node located between the second n-channel transistor and the transistor pair in the fourth logic circuit, wherein the second n-channel transistor has a gate connected to the second input, wherein the p-channel transistor in the transistor pair in the fourth logic circuit has a gate connected to the gate of the second n-channel transistor, and wherein the n-channel transistor in the transistor pair in the fourth logic circuit has a gate connected to the second logic gate output.

17. A digital decoder having first and second inputs and first, second, third, and fourth true and complementary outputs, comprising:

logic circuitry that supplies a high signal to the first true output whenever the first and second inputs are low and that supplies a high signal to the second true output whenever the first and second inputs are high;

first and second logic circuits that are powered using only a positive power supply terminal and that supply output signals for the third and fourth complementary outputs;

third and fourth logic circuits that are powered using only a ground power supply terminal and that supply output signals for the third and fourth true outputs, wherein the first, second, third, and fourth logic circuits each comprise an n-channel and p-channel transistor pair connected in parallel;

in the first logic circuit, a first p-channel transistor connected in series between the transistor pair in the first logic circuit and the positive power supply terminal, wherein the third complementary output is connected to a node located between the first p-channel transistor and the transistor pair in the first logic circuit, wherein the first p-channel transistor has a gate connected to the second input, wherein the n-channel transistor in the transistor pair in the first logic circuit has a gate connected to the gate of the first p-channel transistor, and wherein the p-channel transistor in the transistor pair in the first logic circuit has a gate connected to a NAND gate output;

in the second logic circuit, a second p-channel transistor connected in series between the transistor pair in the second logic circuit and the positive power supply terminal, wherein the fourth complementary output is connected to a node located between the second p-channel transistor and the transistor pair in the second logic circuit, wherein the second p-channel transistor has a gate connected to the first input, wherein the n-channel transistor in the transistor pair in the second logic circuit has a gate connected to the gate of the second p-channel transistor, and wherein the p-channel transistor in the transistor pair in the second logic circuit has a gate connected to the NAND gate output;

in the third logic circuit, a first n-channel transistor connected in series between the transistor pair in the third logic circuit and the ground power supply terminal, wherein the third true output is connected to a node located between the first n-channel transistor and the transistor pair in the third logic circuit, wherein the first n-channel transistor has a gate connected to the first input, wherein the p-channel transistor in the transistor pair in the third logic circuit has a gate connected to the gate of the first n-channel transistor, and wherein the n-channel transistor in the transistor pair in the third logic circuit has a gate connected to a NOR gate output; and in the fourth logic circuit, a second n-channel transistor connected in series between the transistor pair in the fourth logic circuit and the ground power supply terminal, wherein the fourth true output is connected to a node located between the second n-channel transistor and the transistor pair in the fourth logic circuit, wherein the second n-channel transistor has a gate connected to the second input, wherein the p-channel transistor in the transistor pair in the fourth logic circuit has a gate connected to the gate of the second n-channel transistor, and wherein the n-channel transistor in the transistor pair in the fourth logic circuit has a gate connected to the NOR gate output.

18. A digital decoder comprising:

at least two inputs;

at least four true outputs;

at least four complementary outputs that are each inverted with respect to a respective one of the four true outputs;

first logic circuitry that supplies a high output signal to a first of the true outputs and a low signal to a first of the complementary outputs whenever the two inputs are both low;

second logic circuitry that supplies a high output signal to a second of the true outputs and a low signal to a second of the complementary outputs whenever the two inputs are both high;

first and second logic circuits that are powered using only a positive power supply voltage and that have parallel n-channel and p-channel transistors, wherein the first logic circuit supplies a high output signal to a third of the complementary outputs whenever a first of the two inputs is low and a second of the two inputs is high and wherein the second logic circuit supplies a high output signal to a fourth of the complementary outputs whenever the first of the two inputs is high and the second of the two inputs is low;

third and fourth logic circuits that are powered using only a ground power supply voltage and that have parallel n-channel and p-channel transistors, wherein the third logic circuit supplies a high output signal to a third of the true outputs whenever a first of the two inputs is low and a second of the two inputs is high and wherein the fourth logic circuit supplies a high output signal to a fourth of the true outputs whenever the first of the two inputs is high and the second of the two inputs is low, wherein at least one of the first, second, third, and fourth logic circuits comprises a transistor having a gate; and a line connecting one of the true and complementary outputs to the gate.

19. The digital decoder defined in claim 18 wherein the first, second, third, and fourth logic circuits contain only three transistors each.

20. A digital decoder having first and second inputs and first, second, third, and fourth true and complementary outputs, comprising:

logic circuitry that supplies a high signal to the first true output whenever the first and second inputs are low and that supplies a high signal to the second true output whenever the first and second inputs are high;

first and second logic circuits that are powered using only a positive power supply terminal and that supply output signals for the third and fourth complementary outputs;

third and fourth logic circuits that are powered using only a ground power supply terminal and that supply output signals for the third and fourth true outputs, wherein at least one of the first, second, third, and fourth logic circuits comprises a transistor having a gate; and a line connecting one of the first, second, third, and fourth true and complementary outputs to the gate.

21. The digital decoder defined in claim 20 wherein the line is connected to the first true output and wherein the gate is located within the third and fourth logic circuits.

* * * * *